Aug. 6, 1968 KEN-TANG CHOW 3,396,318
CHARGED PARTICLE DETECTOR WITH LITHIUM COMPENSATED INTRINSIC
SILICON AS AN INTERMEDIATE REGION
Filed Sept. 16, 1966

INVENTOR.
KEN-TANG CHOW
BY Hoppe & Mitchell
ATTORNEYS 3,396,318

CHARGED PARTICLE DETECTOR WITH LITHIUM COMPENSATED INTRINSIC SILICON AS AN INTERMEDIATE REGION

Ken-Tang Chow, Portola Valley, Calif., assignor to Electro-Nuclear Laboratories, Inc., Menlo Park, Calif., a corporation of Delaware Continuation-in-part of application Ser. No. 280,783, May 16, 1963. This application Sept. 16, 1966, Ser. No. 584,305
3 Claims. (Cl. 317—234)

ABSTRACT OF THE DISCLOSURE

A high resolution charged particle detector is made from a reverse biased semiconductive wafer of lithium compensated intrinsic silicon by providing an n-type region at one surface and at an opposite surface, a shallow p-type region underlying a thin window for charged particle impingement.

This invention relates generally to charged particle detectors. More particularly it relates to a radiation sensitive wafer of semiconductive material and to methods for making the wafer.

This application is a continuation-in-part of application Ser. No. 280,783, filed May 16, 1963, by Ken-Tang Chow.

One object of this invention is to provide a semiconductive wafer drifted with an impurity and provided with an extremely thin window for detecting, with high resolution, charged particles such as natural alpha particles differing in energy level from one another by as little as 25 kev.

Another object of this invention is to provide a method for forming a lithium drifted semiconductive wafer having a thin oxide surface film and a radiation sensitive depletion region extending through the full wafer thickness.

Figure 1:
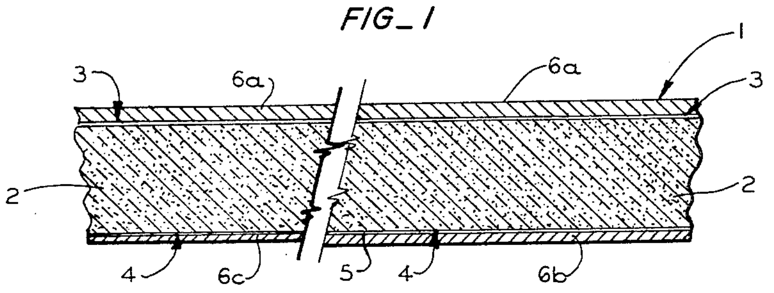
Figure 2:
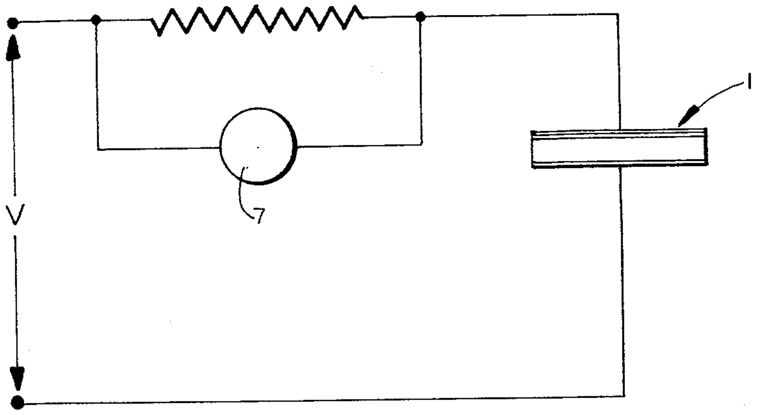

Other objects and advantages of this invention will become apparent to those familiar with this art upon consideration of the following description of a specific embodiment of the device and a method for making it. The specific embodiment is illustrated in the accompanying drawing wherein:

FIG. 1 is a cross sectional view of a semiconductive wafer illustrating on the right a complete structure having features of this invention and fabricated by the method of the invention. FIG. 1 on the left shows the wafer at an intermediate point in its fabrication; and FIG. 2 is a diagram of an electrical circuit employed in the drifting step of the described method.

The wafer structure of this invention, referred to generally as 1, includes a thin crystalline wafer 2 of p-type silicon. A driftable impurity such as metallic lithium, is diffused into one surface of the wafer as at 3 and then drifted through the entire silicon wafer to convert the p-type silicon to one having an intrinsic region and forming an n-type surface on the opposite wafer surface referred to herein as the non-lithium surface 4. Lapping and an oxide coating 5 over surface 4 changes its character to p-type, forming a p-n surface junction. Metallic conductors *6a*, *6b* overlie the lithium rich surface 3 and the oxide coating 5, respectively. In some forms of the invention metallic conductors *6a*, *6b* may be omitted.

Upon application of a reverse bias to the wafer structure across metallic conductors *6a*, *6b* the depletion region of the surface junction formed by the oxide coating 5 and the lithium drifted silicon 2 extends throughout the entire wafer thickness. This is true even for wafer thicknesses within the range of 10 to 50 millimeters. Charged particles impinging upon the oxide coating 5 enter the depletion region and in moving through the region leave a trail of holes and electrons within it. These are swept out by the applied reversed bias in a few nanoseconds. The resulting electrical pulses are a function of the energy dissipated by the impinging charged particles.

The oxide coating forms an extremely thin window through which the charged particles may enter the depletion region of the wafer. The device exhibits extremely high resolution. It can resolve naturally occurring alpha particles differing in energy level from one another by as little as 25 kev.

This structure of the present invention is fabricated by the hereinafter described method which insures development of a depletion region throughout the wafer thickness upon the application of a reverse bias voltage.

First a sliced p-type silicon wafer within the range of 0.1 to 0.5 centimeter in thickness is thoroughly lapped on its two opposed and substantially parallel surfaces until all damage resulting from the slicing process is removed. 1900 grit silicon carbide lapping compound develops a sufficiently smooth surface. These surfaces of the wafer then are etch-polished with an etching solution comprising three parts nitric acid to one part hydrofluoric acid (by volume) for approximately two minutes.

Following the foregoing procedure, which is generally referred to as the pre-diffusion treatment, a driftable impurity such as metallic lithium is diffused into wafer surface 3. To accomplish this the etched wafer surface 3 first is coated with metallic lithium in the form of lithium powder suspended in a mineral oil vehicle. This is painted on the surface. The wafer then is heated on a hot plate with the heat conducted upwardly through the wafer to diffuse the metallic lithium into the p-type silicon. The diffusion process is conducted in an inert atmosphere, for example, in nitrogen or argon, and under controlled temperatures within the range of 300° to 400° C. The resulting lithium rich surface 3 forms a p–n surface junction with the p-type silicon wafer 2.

After this diffusing step the diffused lithium is drifted through the entire thickness of the silicon wafer to its opposite surface as at 4. First the lithium rich surface 3 is lapped lightly and then coated with a nonrectifying electrically conductive film *6a* such as electrolytically plated nickel or evaporated gold or aluminum. A similar nonrectifying electrically conductive film *6c* is applied to the opposite surface 4 of the wafer. The edges of the wafer then are etched with the described etching solution for about two minutes during which the wafer surfaces and overlying conductors *6a*, *6c* are protected by apiezon wax masks. Following the etching, the wax is removed and the wafer then is ready for drifting.

The circuit illustrated in FIG. 2 is employed to drift the lithium or other driftable material through the silicon wafer. A reverse bias voltage, indicated as V applied across the wafer, reverse biases the p–n junction formed by lithium rich surface 3 and the silicon wafer 2. The initial bias voltage is within the range of 200 to 500 v. The drifting temperature is maintained within the range of 110° to 150° C. to establish a satisfactory drift rate. A series connected ammeter 7 indicates completion of the drifting process by a marked increase in current flow as soon as lithium ions have drifted through the wafer 2 to surface 4. When this occurs an n-type surface is established on surface 4 of the wafer and the wafer itself converted to intrinsic type.

This non-lithium surface 4 then is treated first by removing the conductive film *6c* by lapping slightly and by etch-polishing with the described etching solution. During this etching the rest of the wafer again is protected with an apiezon wax mask. A thin oxide film 5 then is formed over the etched non-lithium surface 4. This may be done by immersing the wafer in highly purified hot water at approximately 100° C. for ten minutes. A thin oxide film 5 forms on the surface and changes the surface state of the non-lithium surface 4 to a p-type structure. The modified surface forms a p–n junction with the converted intrinsic type wafer 2. The junction also can be formed by exposing the lapped and etch-polished surface 4 to the atmosphere for two to three days. A thin oxide film is formed on the surface in this manner also to change the surface state as described.

As a final fabrication step a thin conductive film 6*b* such as evaporated gold, aluminum or other metal then is deposited over the oxide surface to complete the structure.

The resulting structure forms an extremely effective charged particle detector having a radiation sensitive depletion region of thicknesses not heretofore considered possible. Various modifications in the described structure and fabrication processes will become apparent to those familiar with this art. For example, the described structure may be formed in only a portion of a silicon wafer.

The foregoing detailed description is given for clearness of understanding only and no unnecessary limitations should be understood therefrom for modifications will be obvious to those skilled in the art.

I claim:

1. A charged particle detector comprising a crystalline semiconductor wafer having a first and second surface defining a lithium compensated intrinsic region disposed therebetween, an n-type region at said first surface and an n-type region at said second surface, said n-type region at said second surface lapped and oxidized to produce a shallow p-type region, in said n-type region said p-type region forming a p–n junction.

2. The charged particle detector of claim 1 wherein the wafer has a thickness of about 1 to 5 millimeters.

3. A charged particle detector comprising a crystalline semiconductor wafer having a first and second surface defining a lithium compensated intrinsic region diposed therebetween, an n-type region at said first surface and an n-type region at said second surface, said n-type region at said second surface lapped and oxidized to produce a shallow p-type region in said n-type region, said p-type region forming a p–n junction, separate conductive metallic films overlying each of said first surface and said oxidized second surface and means for applying a reverse bias between said conductive films to extend the depletion region of the junction through substantially the entire thickness of wafer.

References Cited

UNITED STATES PATENTS

| | | | |
|---|---|---|---|
| 3,091,555 | 4/1963 | Smythe | 117—201 |
| 3,117,229 | 1/1964 | Friedland | 205—83.5 |
| 3,225,198 | 12/1965 | Mayer | 250—83.3 |
| 3,310,443 | 3/1967 | Fessler et al. | 148—188 |

JAMES D. KALLAM, *Primary Examiner.*

M. H. EDLOW, *Assistant Examiner.*